(12) United States Patent
Tanaka et al.

(10) Patent No.: US 8,278,134 B2
(45) Date of Patent: Oct. 2, 2012

(54) PRODUCTION METHOD OF PHOTOELECTRIC CONVERSION DEVICE AND SOLUTION FOR FORMING SEMICONDUCTOR

(75) Inventors: Isamu Tanaka, Higashiomi (JP); Seiichiro Inai, Higashiomi (JP); Yoshihide Okawa, Higashiomi (JP); Daisuke Nishimura, Higashiomi (JP); Sentaro Yamamoto, Kirishima (JP)

(73) Assignee: Kyocera Corporation, Kyoto (JP)

( * ) Notice: Subject to any disclaimer, the term of this patent is extended or adjusted under 35 U.S.C. 154(b) by 68 days.

(21) Appl. No.: 13/062,494

(22) PCT Filed: Mar. 29, 2010

(86) PCT No.: PCT/JP2010/055566
§ 371 (c)(1),
(2), (4) Date: Mar. 4, 2011

(87) PCT Pub. No.: WO2011/121701
PCT Pub. Date: Oct. 6, 2011

(65) Prior Publication Data
US 2011/0244624 A1  Oct. 6, 2011

(51) Int. Cl.
*H01L 21/00* (2006.01)

(52) U.S. Cl. .............. 438/95; 438/84; 438/85; 438/102; 438/500

(58) Field of Classification Search .................... 438/84, 438/85, 95, 102, 104, 500, 502
See application file for complete search history.

(56) References Cited

U.S. PATENT DOCUMENTS

| 6,992,202 | B1 | 1/2006 | Banger et al. | 556/28 |
| 7,663,057 | B2 * | 2/2010 | Yu et al. | 136/264 |
| 8,048,477 | B2 * | 11/2011 | Van Duren et al. | 427/74 |
| 8,067,262 | B2 * | 11/2011 | Fujdala et al. | 438/95 |

OTHER PUBLICATIONS

Jin et al., "CUInS2 films deposited by aerosol-assisted chemical vapor deposition using ternary single-source precursors" Materials Science and Engineering B, vol. 116, pp. 395-401, 2005.
Nairn, et al., "Preparation of Ultrafine Chalcopyrite Nanoparticles via the Photochemical Decomposition of Molecular Single-Source Precursors" Nano Letters, vol. 6, No. 6, pp. 1218-1223, 2006.
Japanese language search report for corresponding PCT application PCT/JP2010/055566 lists the references above.

* cited by examiner

*Primary Examiner* — Fernando L Toledo
*Assistant Examiner* — Bryan Junge
(74) *Attorney, Agent, or Firm* — DLA Piper LLP (US)

(57) ABSTRACT

The production method of a photoelectric conversion device comprises adding a chalcogenide powder of a group-IIIB element to an organic solvent including a single source precursor containing a group-IB element, a group-IIIB element, and a chalcogen element to prepare a solution for forming a semiconductor, and forming a semiconductor containing a group-I-III-VI compound by use of the solution for forming a semiconductor.

9 Claims, 1 Drawing Sheet

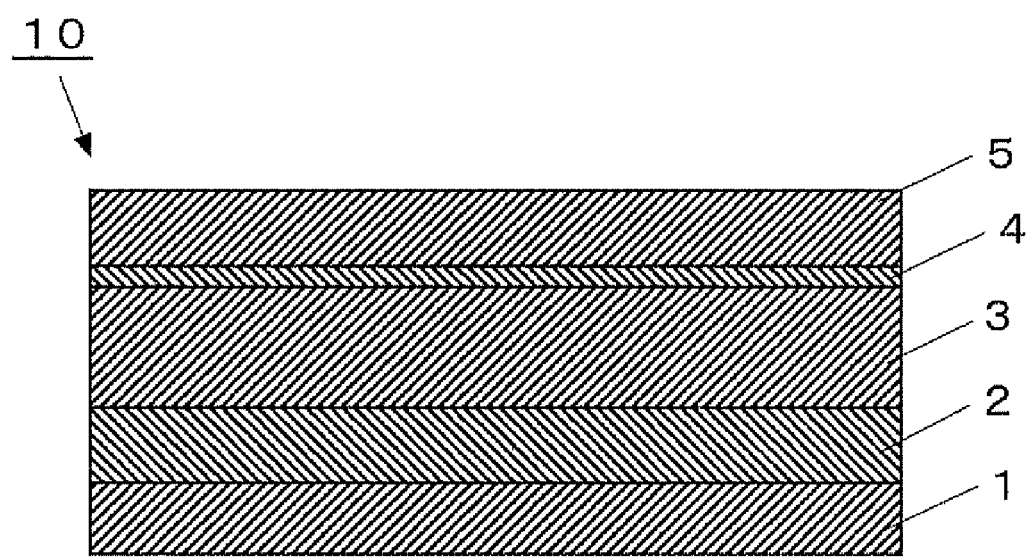

PRODUCTION METHOD OF PHOTOELECTRIC CONVERSION DEVICE AND SOLUTION FOR FORMING SEMICONDUCTOR

CROSS-REFERENCE TO THE RELATED APPLICATIONS

This application is a national stage of international application No. PCT/JP2010/055566, filed on Mar. 29, 2010, the entire contents of which are incorporated herein by reference.

TECHNICAL FIELD

The present invention relates to a production method of a photoelectric conversion device including an optical absorption layer between a pair of electrode layers and a solution for forming a semiconductor.

BACKGROUND ART

FIG. 1 shows a basic structure of common photoelectric conversion devices such as thin film solar cells and the like. In the photoelectric conversion device, as shown in FIG. 1, a first electrode layer 2 composed of, for example, Mo to be a backside electrode is formed on a substrate 1 composed of, for example, soda-lime glass. Further, an optical absorption layer 3 composed of a compound semiconductor thin film is formed on the first electrode layer 2. Further, a transparent second electrode layer 5 composed of ZnO or the like is formed on the optical absorption layer 3 with a buffer layer 4 composed of ZnS, CdS or the like interposed therebetween.

As the optical absorption layer 3 composed of a compound semiconductor, a group-I-III-VI compound semiconductor thin film such as $Cu(In,Ga)Se_2$, which can achieve high energy conversion efficiency, is employed.

Examples of a production method of $Cu(In,Ga)Se_2$ include a production method in which a film is formed by applying a liquid phase raw material. As a production method of using such a liquid phase raw material, for example, a single source precursor method is heretofore known. This method is a production method of forming a $Cu(In,Ga)Se_2$ thin film by allowing Cu, Se, and In or Ga to exist in one organic compound, dissolving the organic compound in an organic solvent, and applying and heat treating the resulting solution (U.S. Pat. No. 6,992,202).

However, in the production method using the above single source precursor, it is difficult to control the composition of the optical absorption layer, that is, a molar ratio (Cu/(In+Ga)), and there is a limitation of improvement in energy conversion efficiency. Therefore, further improvements in energy conversion efficiency of the photoelectric conversion device have been desired.

It is an object of the present invention to provide a photoelectric conversion device having high energy conversion efficiency by controlling composition of the optical absorption layer by use of the single source precursor.

DISCLOSURE OF THE INVENTION

A production method of a photoelectric conversion device according to one embodiment of the present invention comprises adding a chalcogenide powder of a group-IIIB element to an organic solvent including a single source precursor containing a group-IB element, a group-IIIB element, and a chalcogen element to prepare a solution for forming a semiconductor, and forming a semiconductor containing a group-I-III-VI compound by use of the solution for forming a semiconductor.

A solution for forming a semiconductor according to one embodiment of the present invention comprises an organic solvent; a single source precursor containing a group-IB element, a group-IIIB element, and a chalcogen element; and a chalcogenide powder of the group-IIIB element.

BRIEF DESCRIPTIONS OF THE DRAWING

FIG. 1 shows a sectional view showing one example of a photoelectric conversion device.

MODE FOR CARRYING OUT THE INVENTION

A photoelectric conversion device prepared by the production method of the present invention is a photoelectric conversion device 10 including an optical absorption layer between a pair of electrode layers, for example, as shown in FIG. 1. In the photoelectric conversion device 10, a first electrode layer 2 to be a backside electrode is formed on a substrate 1, and an optical absorption layer 3 comprised of a compound semiconductor thin film is formed on the first electrode layer 2. Further, a transparent second electrode layer 5 is formed on the optical absorption layer 3 with a buffer layer 4 interposed therebetween.

As the substrate 1, for example, a soda-lime glass substrate, substrates of metals such as Mo, SUS and the like, and substrates of resins such as polyimide and the like can be used. The first electrode layer 2 is formed on the substrate 1, and the optical absorption layer 3 as a first semiconductor layer is formed on the first electrode layer 2. The buffer layer 4 as a second semiconductor layer having different conductive type from that of the first semiconductor layer is formed on the optical absorption layer 3, and the second electrode layer 5 is formed on the buffer layer 4. Thereby, the photoelectric conversion device 10 including the optical absorption layer 3 between a pair of the first and second electrode layers 2, 5 is configured.

In addition, an example, in which the substrate 1, the first electrode layer 2, the optical absorption layer 3, the buffer layer 4, and the second electrode layer 5 are stacked in order, has been described, various intermediate layers may be formed between the above-mentioned layers. Further, the present invention may be a type of a photoelectric conversion device which does not have the substrate 1, in other words, in which the first electrode layer 2 acts as a substrate.

As the optical absorption layer 3 comprised of a compound semiconductor, a group-I-III-VI compound semiconductor having a chalcopyrite structure, which can achieve high energy conversion efficiency, is employed. As the group-I-III-VI compound semiconductor, $CuInSe_2$, $CuGaSe_2$, $Cu(In,Ga)Se_2$ or the like is used.

The production method of a photoelectric conversion device of the present invention will be described. First, the substrate 1 comprised of soda-lime glass, for example, is prepared. The first electrode layer 2 is formed on the substrate 1. Any one electrode material of molybdenum (Mo), tungsten (W), chromium (Cr), polysilicon ($SiO_2$), metal silicide, aluminum (Al) and the like is preferably used for the first electrode layer 2. The first electrode layer 2 can be formed by a vapor deposition method, a sputtering method, an application method, or the like.

Next, the optical absorption layer 3 is formed on the first electrode layer 2. First, "a solution for forming a semiconductor" for forming the optical absorption layer 3 is prepared.

The solution for forming a semiconductor is a solution in which a single source precursor containing a group-IB element, a group-IIIB element, and a chalcogen element in a complex molecule is dissolved. The group-IB element refers to an element belonging to a group IB in a periodic table (also referred to as a group-11 element), and includes Cu, Ag and the like. The group-IIIB element refers to an element belonging to a group IIIB in a periodic table (also referred to as a group-13 element), and includes Ga, In and the like. The chalcogen element refers to S, Se and Te among elements belonging to a group VIB in a periodic table (also referred to as a group-16 element). When the optical absorption layer 3 is $Cu(In,Ga)Se_2$, the single source precursor contains Cu, In, Ga, and Se. This single source precursor can be prepared by reacting a first complex ion obtained in the step of preparing a first complex ion solution described later with a second complex ion obtained in the step of preparing a second complex ion solution described later.

(Step of Preparing First Complex Ion Solution)

First, a Lewis base L such as $P(C_6H_5)_3$ is reacted with an organic metal salt of Cu (group-IB element) such as $Cu(CH_3CN)_4 \cdot PF_6$ in an organic solvent such as acetonitrile to prepare a first complex ion solution in which the first complex ion exists in the form of $\{P(C_6H_5)_3\}_2Cu(CH_3CN)_2^+$ (the step of preparing a first complex ion solution).

Herein, as the organic metal salt of Cu, halogenides such as CuCl, $CuCl_2$, CuBr, and CuI may be used, and as the Lewis base L, compounds containing N or As, for example, $As(C_6H_5)_3$ or $N(C_6H_5)_3$ may be used. Further, as an organic solvent in which the Lewis base L and the organic metal salt of Cu are dissolved, acetone, methanol, ethanol, and isopropanol can be used in addition to acetonitrile.

The step of preparing a first complex ion solution expressed by the general formula is as follows. When the Lewis base is denoted by L, an organic metal salt of the group-IB element is denoted by $[M'R'_4]^+(X')^-$ (M' represents a group-IB element, R' represents an arbitrary organic ligand, (X')$^-$ represents an arbitrary anion), and the first complex ion is denoted by $[L_2M'R'_2]^+$, a reaction, in which the above first complex ion is formed, is represented by a reaction formula 1.

[Chem 1]

(Reaction Formula 1)

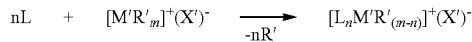

Specific examples of the reaction formula 1 include the case where the first Lewis base is $P(C_6H_5)_3$ and an organic metal salt $[M'R'_m]^+(X')^-$ of the group-IB element is $Cu(CH_3CN)_4^+ \cdot PF_6^-$, and in this case, the first complex ion $[L_nM'R'_{(m-n)}]^+$ is produced as $\{P(C_6H_5)_2Cu(CH_3CN)_2^+ \cdot PF_6^-$.

(Step of Preparing Second Complex Ion Solution)

A second complex ion containing the chalcogen element-containing organic compound and the group-IIIB element is prepared. In addition, the chalcogen element-containing organic compound is an organic compound including a chalcogen element, and examples thereof include thiol, selenol, and tellurol formed by combining a chalcogen element with an organic compound such as acryl, allyl, alkyl, vinyl, perfluoro and carbamate.

For example, an organic compound, produced by the reaction of $NaOCH_3$ with an organic selenium compound or an organic sulfur compound, is reacted with $InCl_3$ or $GaCl_3$ in a solvent comprised of methanol to form a second complex ion in the form of $In\{SeR\}_4^-$ or $Ga\{SeR\}_4^-$. Herein, R represents one selected from acryl, allyl, alkyl, vinyl, perfluoro and carbamate.

As the organic selenium compound, for example, $HSeC_6H_5$ or the like is used, and as the organic sulfur compound, $HSC_6H_5$ or the like is used. Further, a solvent such as ethanol or propanol can be used in place of methanol. In addition, the first complex ion may be prepared prior to the second complex ion, or the second complex ion may be prepared prior to the first complex ion.

The step of preparing a second complex ion solution expressed by the general formula is as follows. When the chalcogen element is denoted by E, a metal salt of the chalcogen element-containing organic compound is denoted by A(ER″) (R″ represents an organic compound and A represents an arbitrary cation), a metal salt of the group-IIIB element is denoted by M″(X″)$_3$ (M″ represents a group-IIIB element and X″ represents an arbitrary anion), and the second complex ion is denoted by $[M''(ER'')_4]^-$, a reaction, in which the above second complex ion is formed, is represented by a reaction formula 2. In addition, the metal salt A(ER″) of the chalcogen element-containing organic compound can be obtained by reacting metal alkoxide such as $NaOCH_3$ with the chalcogen element-containing organic compound such as phenyl selenol ($HSeC_6H_5$).

[Chem 2]

(Reaction Formula 2)

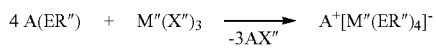

Specific examples of the reaction formula 2 include the case where the metal salt A(ER″) of the chalcogen element-containing organic compound is $NaSeC_6H_5$ and the metal salt M″(X″)$_3$ of the group-IIIB element is $InCl_3$ or $GaCl_3$, and in this case, the second complex ion $[M''(ER'')_4]^-$ is produced as $Na^+[In(SeC_6H_5)_4]^-$ or $Na^+[Ga(SeC_6H_5)_4]^-$.

In addition, the group-IIIB element contained in the second complex ion solution is not limited to one type and a plurality of types of group-IIIB elements may be contained in the second complex ion solution. For example, both In and Ga may be contained in the second complex ion solution. Such a second complex ion solution can be prepared by using a mixture of metal salts of a plurality of types of group-IIIB elements as a raw material of the second complex ion solution. Alternatively, such a second complex ion solution may be prepared by preparing a second complex ion solution containing a type of group-IIIB element for every group-IIIB element, and mixing these solutions.

(Step of Preparing Single Source Precursor)

Next, a single source precursor containing a group-IB element (Cu), a chalcogen element (S or Se), a group-IIIB element (In or Ga), and a Lewis base L is prepared by reacting the first complex ion with the second complex ion. That is, the first complex ion solution including the group-IB element (Cu) is mixed with the second complex ion solution including the group-IIIB element (In or Ga) and the chalcogen element (S or Se) to react the first complex ion with the second complex ion, and thereby a precipitated substance, which includes the group-IB element (Cu), the chalcogen element (S or Se), the group-IIIB element (In or Ga) and the Lewis base L, is obtained. The precipitated substance is separated into a precipitate and a solution above the precipitate, and the solution portion is discharged and the precipitate is dried to prepare a single source precursor.

A temperature at the time when the first complex ion is reacted with the second complex ion is preferably 0 to 30° C. and a reaction time is preferably 1 to 5 hours. A portion precipitated by the reaction is preferably cleaned by use of a technique such as centrifugation or filtration in order to remove impurities such as Na, Cl and the like.

The step of preparing a single source precursor expressed by the general formula is as follows. A reaction, in which such a single source precursor $[L_nM'(ER')_2M''(ER'')_2]$ is formed, is represented by a reaction formula 3.

[Chem 3]

(Reaction Formula 3)

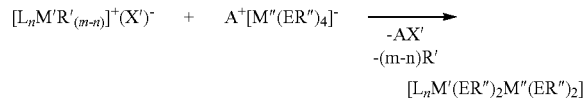

$$[L_nM'R'_{(m-n)}]^+(X')^- + A^+[M''(ER'')_4]^- \xrightarrow[-(m-n)R']{-AX'} [L_nM'(ER'')_2M''(ER'')_2]$$

Specific examples of the reaction formula 3 include the case where the first complex ion is $\{P(C_6H_5)_3\}_2Cu(CH_3CN)_2^+ \cdot PF_6^-$, and the second complex ion is $Na^+[M''(SeC_6H_5)_4]^-$ (M'' is In and/or Ga), and in this case, the single source precursor is produced as $\{P(C_6H_5)_3\}_2Cu(SeC_6H_5)_2M''(SeC_6H_5)_2$.

(Step of Forming Optical Absorption Layer)

In the present invention, it is important to prepare a solution for forming a semiconductor by dissolving the single source precursor thus prepared in an organic solvent, and further dissolving or mixing the chalcogenide powder of the group-IIIB element (e.g., a powder of selenide or sulfide of at least one of In and Ga) in the organic solution in which the single source precursor is dissolved.

As the organic solvent in which the single source precursor is dissolved, toluene, pyridine, xylene, or acetone can be used. Further, specific examples of the chalcogenide powder of the group-IIIB element include $In_2Se$ or $Ga_2Se$ as a selenide powder of In or Ga, and $In_2S$ or $Ga_2S$ as a sulfide powder of In or Ga. These powders are dissolved or mixed in the organic solution in which the single source precursor is dissolved. With respect to these powders, a powder, having an average particle diameter of 0.1 μm or less, is preferably used. This powder is a so-called nanoparticle. By using such a nanoparticle, the powder is easily dissolved in an organic solvent, and can be adequately dispersed in the organic solvent even when a part of the powder does not dissolve to promote the uniformalization of the composition of the optical absorption layer.

In addition, as described above, it is desirable from the viewpoint of the uniformalization of the composition of the optical absorption layer that the chalcogenide powder of the group-IIIB element is dissolved in an organic solvent, but even when the powder is in a state in which the powder is mixed and dispersed in the organic solvent remaining powdery, a certain level of the uniformalization of the composition of the optical absorption layer can be achieved.

The solution for forming a semiconductor thus prepared is applied onto the first electrode layer 2, dried and heat treated, and thereby an optical absorption layer containing a group-I-III-VI compound semiconductor is formed.

That is, the single source precursor is dissolved in an organic solution such as toluene, pyridine, xylene, acetone or the like, and to this organic solvent, the chalcogenide powder of the group-IIIB element such as $In_2Se$, $Ga_2Se$, $In_2S$ or $Ga_2S$ is added, and this powder is dissolved in or mixed with this organic solvent to form a solution for forming a semiconductor. Then, the solution for forming a semiconductor is applied onto the first electrode 2 of the substrate 1 described above and dried, and then is heat treated in a reducing atmosphere, and thereby the optical absorption layer 3 can be formed on the first electrode layer 2. The thickness of the optical absorption layer 3 is, for example, 1.0 to 2.5 μm.

It is preferred that the solution for forming a semiconductor is applied onto the first electrode layer 2 by use of a spin coater, screen printing, dipping, spray, a die coater, or the like. Drying is preferably performed in a reducing atmosphere. A temperature at the time of drying is, for example, 50 to 300° C.

Heat treating is preferably performed in a reducing atmosphere. It is preferably performed particularly in any of a nitrogen atmosphere, a forming gas atmosphere and a hydrogen atmosphere. The reducing atmosphere at the time of heat treating is preferably a reducing atmosphere in which moisture is removed through an absorbent. The absorbent is not particularly limited as long as it can eliminate the moisture, but a molecular sieve (trade name) is suitably used. A heat treating temperature is, for example, 400 to 600° C.

It is preferred to etch a high resistance layer comprised of $Cu_2Se$ at the surface with an aqueous solution of KCN to remove the layer after forming the optical absorption layer 3.

In the production method of a photoelectric conversion device using the solution for forming a semiconductor described above, it is possible to control the composition of the optical absorption layer 3 to have desired composition, and further it is favorably possible to crystallize group-I-III-VI compound semiconductors throughout the optical absorption layer 3. Consequently, a photoelectric conversion device having high energy conversion efficiency can be formed by optimizing a photoelectric conversion function of the optical absorption layer 3.

It is for the following reason that the control of the composition of the optical absorption layer 3 is important. If the single source precursor can prepare an ideal organic compound, it can form a uniform optical absorption layer in which a molar ratio (for example, a molar ratio Cu/(In+Ga)) between the group-IB element and the group-IIIB element is theoretically 1. However, it is difficult to obtain a pure complex ion such as $\{P(C_6H_5)_3\}_2Cu(CH_3CN)_2^+$, and a by-product is produced in addition to the intended single source precursor. Consequently, a compositional ratio of Cu, In, G, and Se fluctuates.

That is, in the method of U.S. Pat. No. 6,992,202, since it is difficult to obtain a pure first complex ion such as $\{P(C_6H_5)_3\}_2Cu(CH_3CN)_2^+$ and the amount of the first complex ion is small, even when a solution including the first complex ion is mixed with a solution including a second complex ion, the amount of the second complex ion, which reacts with the first complex ion, is small, and therefore a precipitate (main product) containing Cu and In or Ga and Se, and a precipitate of a compound containing Cu and Se (by-product) are produced, and in addition to this, In or Ga exists in a solution above the above-mentioned precipitate in the form of a complex ion.

Therefore, since the complex ion of In or Ga in the solution is discharged and removed when the solution above the precipitate is discharged and a remaining precipitate is dried to prepare a precursor, the amount of In or Ga is reduced even though materials are charged in such a way that the molar ratio between Cu and (In+Ga) is 1:1, and particularly Ga is insufficient in quantity since it is easily ionized, and therefore in the optical absorption layer 3 prepared by heat treating the precursor, an optical absorption layer, in which the molar ratio between Cu and (In+Ga) is 1:1, cannot be achieved, and there is a problem that a compound with high conductivity such as $Cu_2Se$ is produced and energy conversion efficiency is decreased. Therefore, when the single source precursor includes a by-product containing the group-IB element like this, it is important to control the composition by adding the group-IIIB element.

Further, even when the single source precursor does not include the by-product described above and can be prepared as an ideal organic compound, it is important to control the composition of the optical absorption layer 3. This is for the following reason. Generally, in a formation process of the group-I-III-VI compound semiconductor, a compound with high conductivity such as $Cu_2Se$ is easily produced, and thereby the electric conductivity of the optical absorption layer 3 is increased and energy conversion efficiency is decreased. In order to suppress such formation of $Cu_2Se$, it is preferable to reduce a molar ratio (for example, a molar ratio Cu/(In+Ga)) between the group-IB element and the group-IIIB element to less than 1. In such a case, it is important to add the group-IIIB element to the single source precursor in which the molar ratio between the group-IB element and the group-IIIB element is 1 to control the composition.

It was difficult to perform such composition control of the optical absorption layer 3 favorably by a conventional production method of a photoelectric conversion device, using a solution in which only a single source precursor is dissolved. That is, in a conventional production method using a solution containing only a single source precursor, it was difficult to form a good semiconductor if trying to control the composition of the optical absorption layer 3. It is supposed that if trying to control the composition of the optical absorption layer 3 by merely adding the group-IIIB element to the single source precursor solution in a state of a metal complex, when the solution is applied to form a coat, the composition of the coat is separated and the composition of the whole coat tends to be nonuniform. Further, it is supposed that it is also because of the low reactivity of a metal complex of the added group-IIIB element and the difficulty in obtaining the group-I-III-VI compound semiconductor.

On the other hand, in the production method of a photoelectric conversion device of the present invention, using a solution for forming a semiconductor, it is supposed that by adding the chalcogenide powder of the group-IIIB element to the solution of the single source precursor, composition separation can be inhibited to form a good coat, and reactivity of semiconductor formation can be improved and therefore the semiconductor formation from the chalcogenide is advanced favorably together with the single source precursor.

In the solution for forming a semiconductor, it is preferred that a chalcogen element-containing ligand coordinates to the surface of the chalcogenide powder of the group-IIIB element. Thereby, the chalcogen element-containing ligand and the single source precursor have good affinity for each other, and the chalcogenide powder of the group-IIIB element exists in a state of being close to the single source precursor. Therefore, since nearly uniform group-I-III-VI compound semiconductors can be formed favorably throughout the optical absorption layer 3, the crystallization is more advanced and energy conversion efficiency can be higher.

In addition, the chalcogen element-containing ligand refers to an organic compound which includes a chalcogen element and can coordinate to the chalcogenide powder of the group-IIIB element. A similar compound to the above-mentioned chalcogen element-containing organic compound can be used as such a chalcogen element-containing ligand. The chalcogen element-containing ligand and the chalcogen element-containing organic compound contained in the single source precursor may be the same compounds, or may be different compounds. It is preferred that the chalcogen element-containing ligand and the chalcogen element-containing organic compound contained in the single source precursor are the same compounds from the viewpoint of enhancing the affinity for the single source precursor.

Furthermore, the chalcogen element-containing ligand preferably has an aromatic ring. Since the aromatic ring has a relatively small molecular shape and high affinity for other organic compounds, it can make the single source precursor and the chalcogenide powder of the group-IIIB element close to each other.

Examples of a method of coordinating the chalcogen element-containing ligand to the surface of the chalcogenide powder of the group-IIIB element include a method in which the chalcogen element-containing ligand is coordinated to the surface of the chalcogenide powder of the group-IIIB element by dissolving the chalcogen element-containing ligand in the solution for forming a semiconductor. Alternatively, the chalcogenide powder of the group-IIIB may be dispersed in the organic solvent, in which the chalcogen element-containing ligand is dissolved, to coordinate the chalcogen element-containing ligand to the surface of the chalcogenide powder of the group-IIIB element, and then this powder may be taken out and a solution for forming a semiconductor may be prepare by using the powder.

Further, the chalcogenide powder of the group-IB element such as a Cu selenide powder or a Cu sulfide powder can be dissolved in or mixed with the organic solvent, in which the above single source precursor is dissolved, beside the chalcogenide powder of the group-IIIB element. Thereby, the composition (for example, a molar ratio Cu/(In+Ga)) of the optical absorption layer 3 can be more easily controlled.

Further, in the above-mentioned step of preparing a first complex ion, it is preferred to blend the Lewis base and the organic metal salt of the group-IB element in such a way that the molar number of the organic metal salt is smaller than that of the Lewis base. Thereby, the production of a by-product such as compounds of Cu and Se during the step of preparing a first complex ion can be suppressed, and a first complex ion such as $\{P(C_6H_5)_3\}_2Cu(CH_3CN)_2^+$ can be easily prepared in large amounts. Therefore, it becomes possible to form the group-I-III-VI compound semiconductor well. Here, it is preferred to blend the Lewis base (denoted by L) and the organic metal salt (denoted by M) of the group-IB element in such a way that a molar ratio (M|L) is 1/3 or less from the viewpoint of bringing the molar ratio between the group-IB element and the group-IIIB element of the optical absorption layer to be prepared close to 1. Further, it is preferred to blend in such a way that the molar ratio (M|L) is 1/10 or more from the viewpoint of making the group-I-III-VI compound semiconductor to be formed dense.

(Formation of Buffer Layer and Second Electrode Layer)

An n-type buffer layer 4 for a heterojunction is formed on the optical absorption layer 3. As a material of the buffer layer 4, for example, CdS, ZnS, ZnSe, ZnMgO, ZnO, InS, InSe, $In(OH)_3$, ZnInSe, ZnInS, CuI or $Mg(OH)_2$ is used. These can be prepared by immersing the substrate, on which layers up to the optical absorption layer 3 are formed, in an aqueous solution by a dip-coating method or a CBD method (a solution growth method) to deposit fine particles and carrying out a heat treatment.

Next, a transparent second electrode layer 5 comprised of ITO or ZnO is formed on the buffer layer 4. The second electrode layer 5 can be formed by sputtering, spraying, or coating. The thickness of the buffer layer 4 is, for example, 10 to 200 nm and the thickness of the second electrode layer 5 is, for example, 0.5 to 3.0 μm.

Hereinafter, the production method of a photoelectric conversion device and the solution for forming a semiconductor of the present invention will be described in detail by way of examples and comparative examples, but the present invention is not limited to the following examples.

EXAMPLES

As an organic metal salt of Cu, 1 mmol of $Cu(CH_3CN)_4 \cdot PF_6$ and as a Lewis base L, each of 10 mmol, 3 mmol, 2 mmol and 1 mmol of $P(C_6H_5)_3$ were dissolved in 10 ml of acetonitrile to prepare a solution in which a molar ratio (Cu/L) between $Cu(CH_3CN)_4 \cdot PF_6$ and $P(C_6H_5)_3$ was each of 1/10, 1/3, 1/2 and 1/1 as shown in Table 1. After confirming that each of these solutions was uniformly dissolved, the solution was stirred at room temperature for 5 hours with a magnetic stirrer to prepare a first complex ion solution containing a first complex ion (step of preparing first complex ion solution).

On the other hand, 4 mmol of $NaOCH_3$ and 4 mmol of $HSeC_6H_5$ were dissolved in 30 ml of methanol, and then $InCl_3$ and/or $GaCl_3$ were dissolved in such a way that a total of $InCl_3$ and $GaCl_3$ is 1 mmol. After confirming that the $InCl_3$ and/or $GaCl_3$ were completely dissolved, the solution was stirred at room temperature for 5 hours with a magnetic stirrer to prepare a second complex ion solution containing a second complex ion (step of preparing second complex ion solution). The charged composition of Cu, Se, In, and Ga are described in Table 1.

Next, the second complex ion solution was added dropwise to the first complex ion solution at a rate of 10 ml/min. Thereby, it was observed that a white precipitate is produced during adding dropwise. After the completion of adding dropwise, the resulting mixture was stirred at room temperature for one hour with a magnetic stirrer, and consequently a precipitate was settled out.

The operation that the solvent was separated by a centrifugal separator and the precipitate was dispersed in 50 ml of methanol and centrifuged was repeated two times in order to take out only the precipitate.

The precipitate was dried at room temperature in vacuum to remove the solvent to prepare a single source precursor. The composition analysis of the optical absorption layer was carried out by emission spectroscopy (ICP) and the results are shown in Table 1.

Pyridine was added to the single source precursor to prepare a solution in which the content of the single source precursor is 50% by mass with respect to the whole amount. Thereafter, to this solution, an $In_2Se_3$ powder, a $Ga_2Se_a$ powder, an $In_2S_3$ powder and a $Ga_2S_3$ powder shown in Table 2, having an average particle diameter of 0.02 μm, were added in amount mol % shown in Table 2 with respect to the single source precursor, and the resulting mixture was dissolved to prepare a solution for forming a semiconductor. In addition, in the samples 9 and 10, $In_2Se_3$ powders, having an average particle diameter of 0.1 μm, were used. The average particle diameter was determined by image processing of a SEM photograph of the powders.

The solution for forming a semiconductor was applied by a doctor blade process to form a thin film on a first electrode layer comprised of Mo on a soda-lime glass substrate. The thin film was formed by applying the solution for forming a semiconductor using a nitrogen gas as a carrier gas in a glove box to perform application to the first electrode layer. After applying the solution, the soda-lime glass substrate was dried for 5 minutes while heating the substrate at 110° C. with a hot plate.

After forming the thin film, the thin film was subjected to heat treatment in an atmosphere of hydrogen gas. With respect to the conditions of heat treatment, the temperature of the thin film was rapidly raised to 525° C. in 5 minutes and maintained at 525° C. for one hour, and the thin film was cooled in the air to prepare an optical absorption layer comprised of a compound semiconductor thin film having a thickness of 1.5 μm. The composition analysis of the optical absorption layer was carried out by emission spectroscopy (ICP) and the results are shown in Table 2.

Thereafter, the substrate was immersed in a solution formed by dissolving cadmium acetate and thiourea in ammonia to form a buffer layer comprised of CdS having a thickness of 0.05 μm on the compound semiconductor thin film. Moreover, an Al-doped zinc oxide film (second electrode layer) was formed on the buffer layer by a sputtering method. Finally, an aluminum electrode (extraction electrode) was formed by vapor deposition to prepare a photoelectric conversion device.

TABLE 1

| Sample No. | Cu/L molar ratio | Charged composition (mol) | | | | Composition of single source precursor (mol) | | | |
|---|---|---|---|---|---|---|---|---|---|
| | | Cu | In | Ga | Se | Cu | In | Ga | Se |
| 1 | 1/10 | 1 | 0.7 | 0.3 | 4 | 1 | 0.72 | 0.27 | 4.05 |
| 2 | 1/3 | 1 | 0.7 | 0.3 | 4 | 1 | 0.71 | 0.25 | 3.95 |
| 3 | 1/2 | 1 | 0.7 | 0.3 | 4 | 1 | 0.65 | 0.15 | 3.62 |
| 4 | 1/1 | 1 | 0.7 | 0.3 | 4 | 1 | 0.57 | 0.11 | 3.22 |
| 5 | 1/10 | 1 | 1 | 0 | 4 | 1 | 1.02 | 0 | 4.06 |
| 6 | 1/3 | 1 | 1 | 0 | 4 | 1 | 0.95 | 0 | 3.97 |
| 7 | 1/2 | 1 | 1 | 0 | 4 | 1 | 0.72 | 0 | 3.51 |
| 8 | 1/1 | 1 | 1 | 0 | 4 | 1 | 0.61 | 0 | 3.01 |
| 9 | 1/10 | 1 | 0 | 1 | 4 | 1 | 0 | 0.98 | 3.97 |
| 10 | 1/3 | 1 | 0 | 1 | 4 | 1 | 0 | 0.95 | 3.92 |
| 11 | 1/2 | 1 | 0 | 1 | 4 | 1 | 0 | 0.62 | 3.62 |
| 12 | 1/1 | 1 | 0 | 1 | 4 | 1 | 0 | 0.58 | 2.99 |
| 13 | 1/2 | 1 | 0.7 | 0.3 | 4 | 1 | 0.65 | 0.15 | 3.62 |
| 14 | 1/3 | 1 | 0.7 | 0.3 | 4 | 1 | 0.71 | 0.25 | 3.95 |
| 15 | 1/3 | 1 | 0.7 | 0.3 | 4 | 1 | 0.71 | 0.25 | 3.95 |
| 16 | 1/3 | 1 | 0.7 | 0.3 | 4 | 1 | 0.71 | 0.25 | 3.95 |
| 17 | 1/3 | 1 | 0.7 | 0.3 | 4 | 1 | 0.71 | 0.25 | 3.95 |
| 18 | 1/3 | 1 | 0.7 | 0.3 | 4 | 1 | 0.71 | 0.25 | 3.95 |
| *19 | 1/3 | 1 | 0.7 | 0.3 | 4 | 1 | 0.71 | 0.25 | 3.95 |
| *20 | 1/1 | 1 | 0.7 | 0.3 | 4 | 1 | 0.57 | 0.10 | 3.22 |

A symbol * indicates a sample out of the scope of the present invention.

TABLE 2

| Sample No. | Powder dissolved in organic solvent (% by mol) | | | | Composition of optical absorption layer (mol) | | | | |
|---|---|---|---|---|---|---|---|---|---|
| | $In_2Se_3$ | $Ga_2Se_3$ | $In_2S_3$ | $Ga_2S_3$ | Cu | In | Ga | Se | Cu/(In + Ga) |
| 1 | 30 | 5 | 0 | 0 | 1 | 0.87 | 0.30 | 4.58 | 0.86 |
| 2 | 30 | 5 | 0 | 0 | 1 | 0.86 | 0.28 | 4.48 | 0.88 |

TABLE 2-continued

| Sample No. | Powder dissolved in organic solvent (% by mol) | | | | Composition of optical absorption layer (mol) | | | | |
| --- | --- | --- | --- | --- | --- | --- | --- | --- | --- |
| | $In_2Se_3$ | $Ga_2Se_3$ | $In_2S_3$ | $Ga_2S_3$ | Cu | In | Ga | Se | Cu/(In + Ga) |
| 3 | 40 | 10 | 0 | 0 | 1 | 0.85 | 0.20 | 4.37 | 0.95 |
| 4 | 40 | 10 | 0 | 0 | 1 | 0.83 | 0.18 | 4.12 | 0.99 |
| 5 | 0 | 15 | 0 | 0 | 1 | 1.02 | 0.08 | 4.29 | 0.91 |
| 6 | 0 | 20 | 0 | 0 | 1 | 0.95 | 0.10 | 4.27 | 0.95 |
| 7 | 0 | 60 | 0 | 0 | 1 | 0.72 | 0.30 | 4.41 | 0.98 |
| 8 | 0 | 80 | 0 | 0 | 1 | 0.61 | 0.40 | 4.15 | 0.99 |
| 9 | 20 | 0 | 0 | 0 | 1 | 0.1 | 0.98 | 4.27 | 0.93 |
| 10 | 20 | 0 | 0 | 0 | 1 | 0.1 | 0.95 | 4.22 | 0.95 |
| 11 | 50 | 30 | 0 | 0 | 1 | 0.25 | 0.77 | 4.82 | 0.98 |
| 12 | 50 | 40 | 0 | 0 | 1 | 0.25 | 0.78 | 4.45 | 0.97 |
| 13 | 40 | 10 | 10 | 5 | 1 | 0.9 | 0.23 | 4.37 | 0.89 |
| 14 | 20 | 5 | 10 | 5 | 1 | 0.86 | 0.30 | 4.33 | 0.86 |
| 15 | 0 | 0 | 20 | 10 | 1 | 0.81 | 0.30 | 3.95 | 0.90 |
| 16 | 0 | 0 | 40 | 20 | 1 | 0.91 | 0.35 | 3.95 | 0.79 |
| 17 | 0 | 0 | 50 | 0 | 1 | 0.96 | 0.25 | 3.95 | 0.83 |
| 18 | 0 | 0 | 0 | 50 | 1 | 0.71 | 0.50 | 3.95 | 0.83 |
| *19 | 0 | 0 | 0 | 0 | 1 | 0.71 | 0.25 | 3.95 | 1.04 |
| *20 | 0 | 0 | 0 | 0 | 1 | 0.57 | 0.10 | 3.22 | 1.49 |

A symbol * indicates a sample out of the scope of the present invention.

It is evident from Tables 1 and 2 that since the optical absorption layer is formed by using a solution for forming a semiconductor prepared by adding an $In_2Se$ powder, a $Ga_2Se_3$ powder, an $In_2S_3$ powder and a $Ga_2S_3$ powder to an organic solution in which the single source precursor is dissolved, and dissolving or mixing the powder(s) in or with the organic solution, a molar ratio (Cu/(In+Ga)) can be less than 1, and the molar ratio (Cu/(In+Ga)) of the optical absorption layer can be arbitrarily controlled by controlling the amounts of the $In_2Se_3$ powder, the $Ga_2Se_3$ powder, the $In_2S_3$ powder and the $Ga_2S_3$ powder to be added.

Further, it is evident that when the molar ratio (Cu/L) between $Cu(CH_3CN)_4 \cdot PF_6$ and $P(C_6H_5)_3$ was 1/3 or less in the step of preparing a first complex ion, a single source precursor having the composition close to the charged composition is obtained, the production of $Cu(In,Ga)Se_2$ can be promoted even after heat treatment and energy conversion efficiency can be improved.

Energy conversion efficiency of each of the photoelectric conversion devices of these samples No. 1 to 20 was measured. The so-called fixed light solar simulator was used for energy conversion efficiency, and the energy conversion efficiency under the condition that the intensity of light irradiation to a light-receiving surface of an photoelectric conversion device is 100 mW/cm² and AM (air mass) is 1.5 was measured. Consequently, it was evident that while the energy conversion efficiency of the sample 19 and sample 20 as comparative examples were 4% and 2%, respectively, the samples 1 to 18 have as high energy conversion efficiency as 10% or more.

EXPLANATION OF SYMBOLS

1 substrate
2 first electrode layer
3 optical absorption layer
4 buffer layer
5 second electrode layer

The invention claimed is:

1. A production method of a photoelectric conversion device, comprising:
   adding a chalcogenide powder of a group-IIIB element to an organic solvent including a single source precursor containing a group-IB element, a group-IIIB element, and a chalcogen element to prepare a solution for forming a semiconductor; and
   forming a semiconductor containing a group-I-III-VI compound by use of the solution for forming a semiconductor.

2. The production method of a photoelectric conversion device according to claim 1, wherein the step of forming a semiconductor containing a group-I-III-VI compound comprises:
   forming a coat from the solution for forming a semiconductor, and then heating the coat.

3. The production method of a photoelectric conversion device according to claim 1, further comprising coordinating a chalcogen element-containing ligand to the surface of the chalcogenide powder of a group-IIIB element.

4. The production method of a photoelectric conversion device according to claim 3, wherein the chalcogen element-containing ligand includes an aromatic ring.

5. The production method of a photoelectric conversion device according to claim 1, wherein in the step of preparing a solution for forming a semiconductor,
   the chalcogenide powder of a group-IIIB element, when added, has an average particle diameter of 0.1 μm or less.

6. The production method of a photoelectric conversion device according to claim 1, wherein the step of preparing a solution for forming a semiconductor further comprises
   adding a chalcogenide powder of the group-IB element to the organic solvent.

7. The production method of a photoelectric conversion device according to claim 1, wherein the single source precursor is produced by a production method comprising:
   preparing a first complex ion solution in which a first complex ion containing a Lewis base and the group-IB element exists;
   preparing a second complex ion solution in which a second complex ion containing a chalcogen element-containing organic compound and the group-IIIB element exists; and
   mixing the first complex ion solution and the second complex ion solution to react them with each other to produce the single source precursor.

8. The production method of a photoelectric conversion device according to claim 7, wherein the step of preparing a first complex ion solution comprises;

mixing the Lewis base and an organic metal salt of the group-IB element in such a way that the molar number of the organic metal salt is smaller than the molar number of the Lewis base.

9. The production method of a photoelectric conversion device according to claim 8, wherein when the molar number of the Lewis base is denoted by L and the molar number of the organic metal salt is denoted by M, a molar ratio (M/L) is 1/3 or less.

* * * * *